United States Patent [19]

Ooga

[11] Patent Number: 5,408,687
[45] Date of Patent: Apr. 18, 1995

[54] DIRECT DIGITAL SYNTHESIZER WITH A CENTRAL FREQUENCY CONTROLLABLE FILTER

[75] Inventor: Toshiyuki Ooga, Tokyo, Japan
[73] Assignee: NEC Corporation, Japan
[21] Appl. No.: 997,084
[22] Filed: Dec. 29, 1992
[30] Foreign Application Priority Data Jan. 8, 1992 [JP] Japan .................................. 4-001344

[51] Int. Cl.$^6$ .......................... H03L 7/18; H04B 1/40
[52] U.S. Cl. ...................................... 455/76; 455/260; 455/310; 331/18; 331/25
[58] Field of Search ................... 455/75, 76, 259, 260, 455/266, 307, 310, 317, 318, 340; 331/1 A, 18, 25, 34; 375/81, 97, 120

[56] References Cited

U.S. PATENT DOCUMENTS

| | | | |
|---|---|---|---|
| 4,951,004 | 8/1990 | Sheffer et al. | 331/1 A |
| 4,965,533 | 10/1990 | Gilmore | 331/18 |
| 5,028,887 | 7/1991 | Gilmore | 331/18 |
| 5,130,671 | 7/1992 | Shahriary et al. | 331/16 |

Primary Examiner—Reinhard J. Eisenzopf
Assistant Examiner—Chi H. Pham
Attorney, Agent, or Firm—Laff, Whitesel, Conte & Saret, Ltd.

[57] ABSTRACT

A synthesizer for use in a transmitter/receiver effectively eliminates spurious signals contained in an output signal. The synthesizer has a direct digital synthesizer for producing an output signal having a frequency corresponding to oscillation frequency data, and a voltage-controlled variable bandpass filter to which the output signal from the direct digital synthesizer is supplied. The oscillation frequency data is also supplied to a ROM, from which control voltage data corresponding to the supplied oscillation frequency data is read. The control voltage data from the ROM is supplied to a D/A converter which applies a control voltage to the voltage-controlled variable bandpass filter. The center frequency of the passband of the voltage-controlled variable bandpass filter is controlled by the applied control voltage in conformity with the frequency of the output signal from the direct digital synthesizer. The output signal from the direct digital synthesizer passes through a narrow passband of the voltage-controlled variable bandpass filter, so that spurious signals are eliminated from the output signal from the direct digital synthesizer.

2 Claims, 2 Drawing Sheets

DIRECT DIGITAL SYNTHESIZER WITH A CENTRAL FREQUENCY CONTROLLABLE FILTER

BACKGROUND OF THE INVENTION

1. Field of the Invention

The present invention relates to a synthesizer for use in a transmitter/receiver in a microwave satellite communication system or the like.

2. Description of the Related Art

FIG. 1 of the accompanying drawings shows a conventional synthesizer for use in a transmitter/receiver. The conventional synthesizer shown in FIG. 1 comprises a direct digital synthesizer (DDS) 20 and a bandpass filter 24. As shown in FIG. 2 of the accompanying drawings, the DDS 20 comprises an adder 21, a waveform table 22 which generally comprises a read-only memory (ROM), and a digital-to-analog (D/A) converter 23.

When oscillation frequency data DI (of n bits) is supplied to the adder 21, the adder 21 cumulatively adds the supplied oscillation frequency data DI in synchronism with a clock signal CK having a frequency f. Based on the sum from the adder 21, the waveform table 22 produces a sine-wave waveform data which are supplied to the D/A converter 23 which generates a sine-wave output signal. The sine-wave output signal from the D/A converter 23 passes through the bandpass filter 24, which produces an output signal DQ.

The conventional synthesizer shown in FIGS. 1 and 2 offers the following advantages:

(1) Since the accuracy of the frequency of the output signal DQ is governed by the accuracy of the frequency f of the clock signal CK, if the clock signal CK is of low phase noise, then the output signal DQ of the synthesizer 2 is of the same low phase noise level.

(2) The frequency of the output signal DQ can quickly be changed into any frequency without interrupting the output signal DQ.

(3) When the oscillation frequency data DI is varied, the digital signal can directly be frequency-modulated.

However, the conventional synthesizer also suffers the following shortcoming:

The bandpass filter 24 has a fixed passband which is required to be wide enough to pass the output signal from the DDS 20 which varies as the oscillation frequency data DI varies. The bandpass filter 24 of such a wide passband is however unable to eliminate spurious signals sufficiently from the output signal.

SUMMARY OF THE INVENTION

It is an object of the present invention to provide a synthesizer for use in a transmitter/receiver, which is capable of effectively eliminating spurious signals from an output signal with a voltage-controlled variable bandpass filter whose center frequency is controlled in conformity with the oscillation frequency.

According to the present invention, there is provided a synthesizer for use in a transmitter/receiver, comprising a direct digital synthesizer to be supplied with oscillation frequency data and for producing an output signal having a frequency corresponding to the oscillation frequency data, control voltage generating means for generating a control voltage corresponding to the oscillation frequency data, and a voltage-controlled variable bandpass filter for filtering the output signal from the direct digital synthesizer, the voltage-controlling variable bandpass filter having a passband whose center frequency is controllable in substantial conformity with the frequency of the output signal from the direct digital synthesizer based on the control voltage generated by the control voltage generating means.

The voltage control generating means preferably comprises a read-only memory which stores control voltage data corresponding to the oscillation frequency data supplied thereto, for outputting the control voltage data corresponding to the oscillation frequency data, and a digital-to-analog converter for converting the control voltage data from the read-only memory into an analog voltage as the control voltage.

The passband of the voltage-controlled variable bandpass filter is preferably narrow enough to pass only a desired output signal from the direct digital synthesizer.

The direct digital synthesizer preferably comprises an adder for cumulatively adding the supplied oscillation frequency data in synchronism with a clock signal, a waveform table which stores digital data according to a sine wave at each address, for producing the stored digital data addressed by a sum signal from the adder in synchronism with the clock signal, and a digital-to-analog converter for converting the digital data from the waveform table into an analog output signal in synchronism with the clock signal.

If the output signal from a conventional synthesizer has a frequency band from 20 MHz to 40 MHz, for example, then the bandpass filter thereof has the same passband. When the output signal has a frequency of 20 MHz, the secondary harmonic having a frequency of 40 MHz cannot be eliminated from the output signal. With the synthesizer according to the present invention, however, the output signal having a frequency of 20 MHz is filtered by the voltage-controlled variable bandpass filter whose passband is narrow and whose center frequency is controlled into conformity with the desired 20 MHz. As a result, the secondary harmonic can be eliminated from the output signal.

The above and other objects, features, and advantages of the present invention will become apparent from the following description and the appended claims, taken in conjunction with the accompanying drawings.

DETAILED DESCRIPTION OF THE PREFERRED EMBODIMENT

Figure 3:
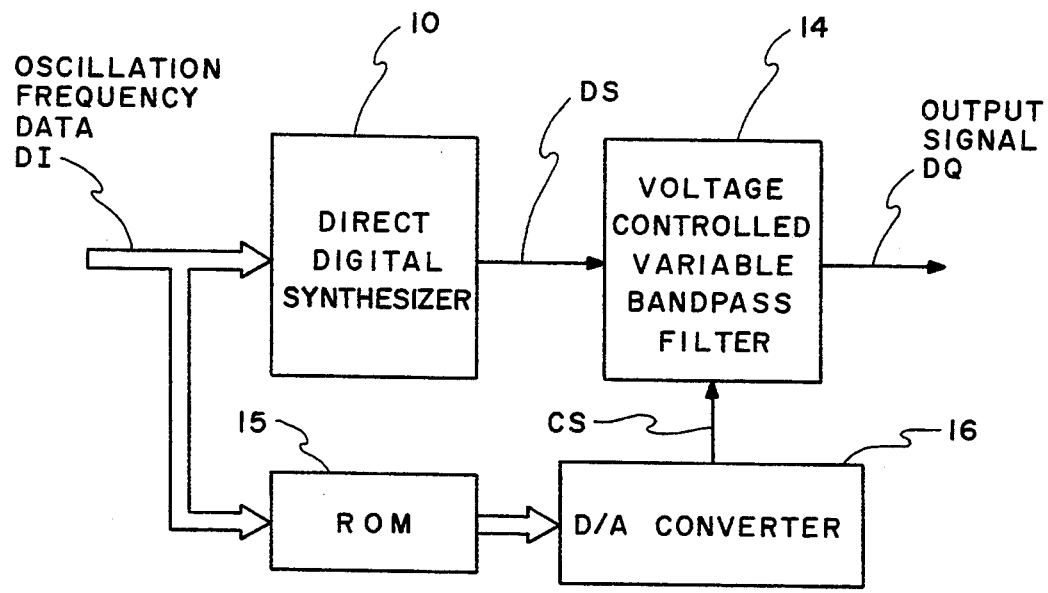
FIG. 3 is a block diagram of a synthesizer for a transmitter/receiver according to the present invention.

As shown in FIG. 3, the synthesizer includes a direct digital synthesizer (DDS) 10 which is supplied with oscillation frequency data DI and produces an output signal DS having a frequency corresponding to the oscillation frequency data DI.

The synthesizer also has a voltage-controlled variable bandpass filter 14 having a passband whose center frequency is determined based on a control voltage CS applied to the bandpass filter 14. The voltage-controlled variable bandpass filter 14 has a narrow passband to eliminate spurious signals from the output signal DS, and produces an output signal DQ. Only the desired signal DQ passes through the filter 14.

A ROM 15 stores control voltage data corresponding to the oscillation frequency data DI which causes the DDS 10 to produce the signal DS. When the oscillation frequency data DI is supplied to the ROM 15, the ROM 15 outputs stored control voltage data from its address indicated by the supplied frequency data DI.

The synthesizer also has a D/A converter 16 which converts the control voltage data from the ROM 15 into an analog voltage signal, and supplies the analog voltage signal as the control voltage CS to the voltage-controlled variable bandpass filter 14.

Figure 1:
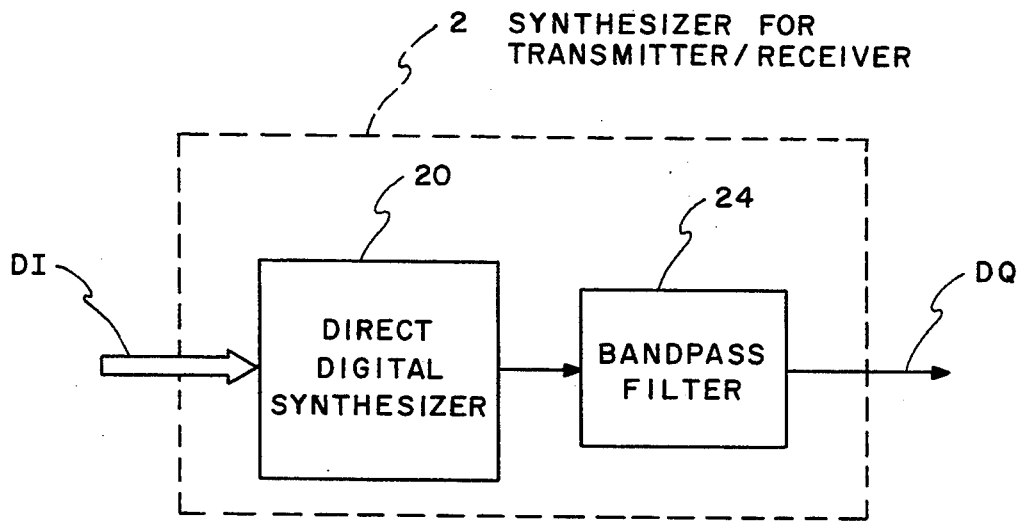
FIG. 1 is a block diagram of a conventional synthesizer for a transmitter/receiver.
Figure 2:
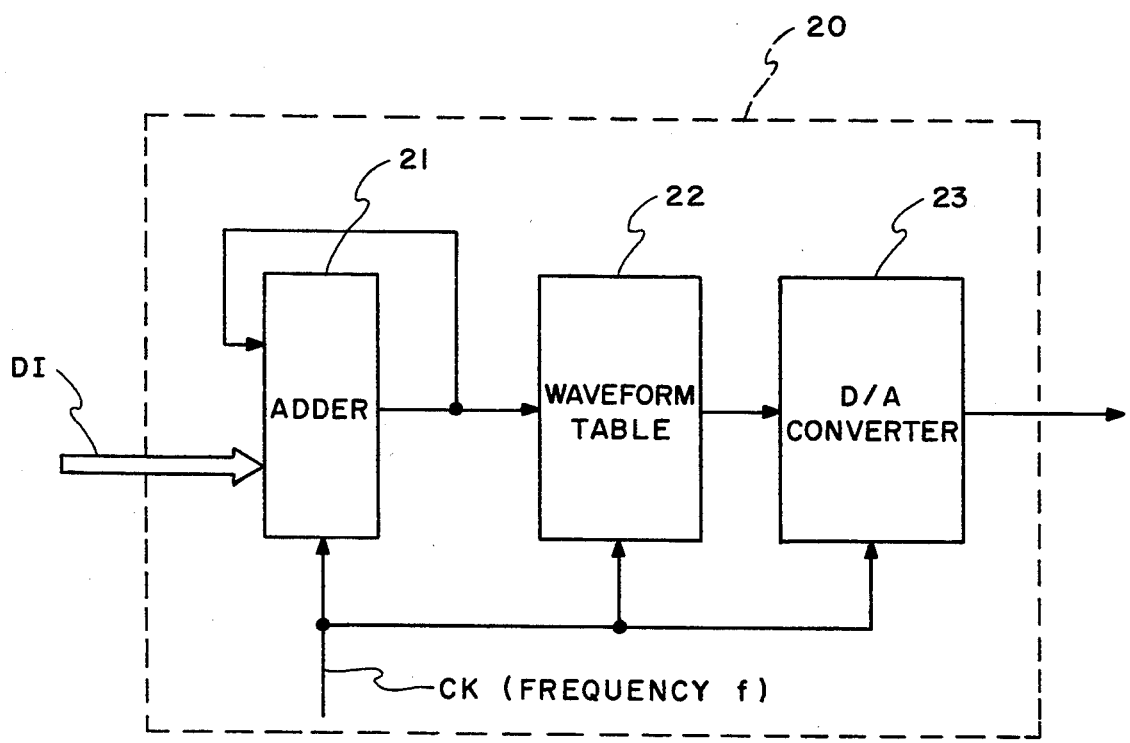
FIG. 2 is a detailed block diagram of a direct digital synthesizer in the conventional synthesizer shown in FIG. 1.
Figure 4:
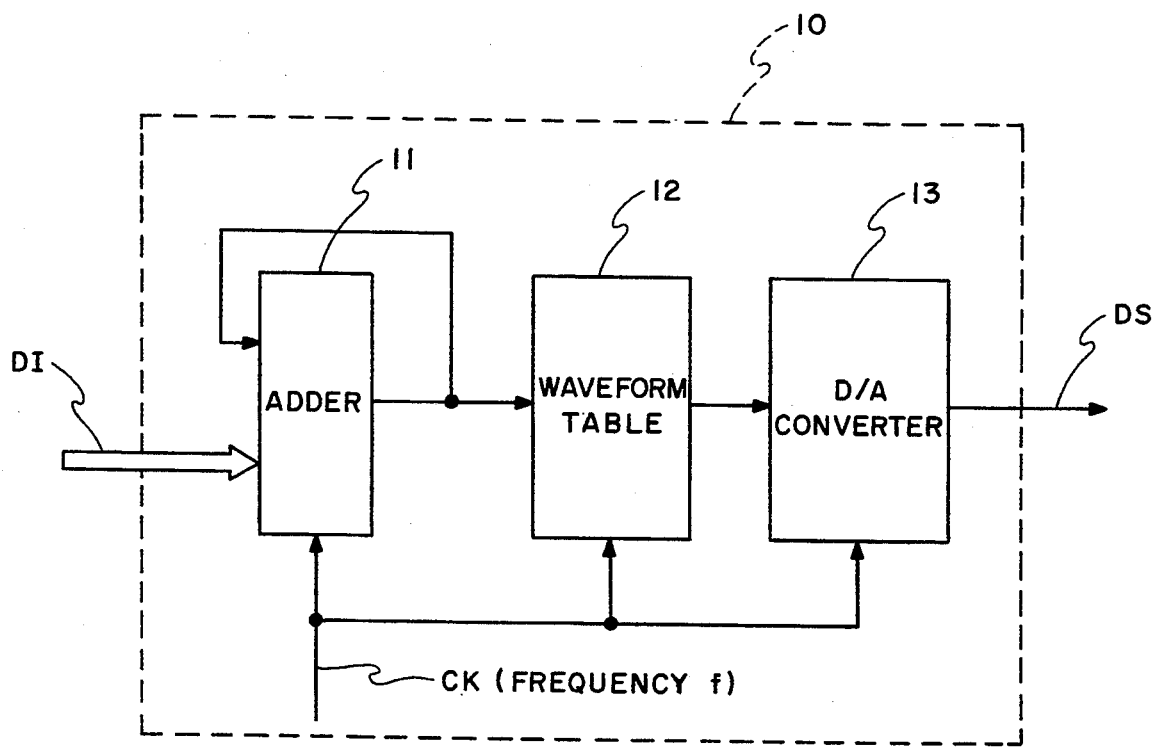
FIG. 4 is a detailed block diagram of a direct digital synthesizer in the synthesizer shown in FIG. 3.

The DDS 10 will be described in detail below with reference to FIG. 4. The DDS 10 is substantially identical to the conventional DDS 20 shown in FIG. 1, and comprises an adder 11, a waveform table 12 which generally comprises a ROM, and a D/A converter 13.

When the oscillation frequency data DI (of n bits) is supplied to the adder 11, the adder 11 cumulatively adds the supplied oscillation frequency data DI in synchronism with a clock signal CK having a frequency f, and produces a digital output signal DSm having a bit length m. Since the bit length of the adder 11 is finite, it overflows with a frequency Tm which is indicated by the following equation (1):

$$Tm = (D/2^m) \times f \tag{1}$$

The frequency Tm determines the frequency of the output signal DS from the DDS 10.

The content of the output signal from the adder 11 corresponds to the phase of the waveform thereof. According to the output signal from the adder 11, a sine-wave waveform is read from the waveform table 12. Upper k ($m \geq k$) bits of the output signal from the adder 11 are used to read the sine-wave waveform from the waveform table 12. As a result, the waveform table 12 has a phase-to-amplitude conversion function.

The output signal from the waveform table 12, which is in the form of a binary code of the amplitude data of a sine wave, is converted into the signal DS of analog sine wave by the D/A converter 16 in synchronism with the clock signal CK.

As can be seen from the above equation (1), the frequency of the signal DS can be varied by varying the oscillation frequency data DI. This is equivalent to the fact that it is possible to determine how may addresses are skipped in the waveform table to produce an output signal therefrom or how much the phase is advanced at the same clock period.

As described above, the frequency of the output signal DQ is determined by the oscillation frequency data DI and the frequency of the clock signal CK.

Operation of the synthesizer shown in FIG. 3 will be described below.

Oscillation frequency data DI is applied to the DDS 10 to enable it to produce a desired output signal DQ. The output signal DS whose frequency corresponds to the oscillation frequency data DI is supplied from the DDS 10 to the voltage-controlled variable bandpass filter 14 to produce the signal DQ.

The oscillation frequency data DI is also supplied to the ROM 15, and control Voltage data corresponding to the oscillation frequency data DI is read from the ROM 15. The control voltage data from the ROM 15 is then supplied to the D/A converter 16 which converts the control voltage data into a control voltage CS and applies the control voltage CS to the voltage-controlled variable bandpass filter 14. The voltage-controlled variable bandpass filter 14 has a narrow passband which can eliminate spurious signals and whose center frequency varies depending on the control voltage CS. The center frequency fc of the passband of the voltage-controlled variable bandpass filter 14 is controlled into conformity with the frequency of the output signal DS and the output signal DQ. As a result, the synthesizer can sufficiently eliminate spurious signals from the output signal, and produce a high-quality output signal.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within the scope of the invention.

What is claimed is:

1. A synthesizer for use in a transmitter/receiver, said synthesizer comprising:

a direct digital synthesizer to be supplied with oscillation frequency data and for producing an output signal having a frequency corresponding to the oscillation frequency data;

control voltage generating means for generating a control voltage corresponding to the oscillation frequency data; and a voltage-controlled variable bandpass filter for filtering the output signal from said direct digital synthesizer, said voltage-controlled variable bandpass filter having a passband with a center frequency which is controllable in substantial conformity with the frequency of the output signal from said direct digital synthesizer based on the control voltage generated by said control voltage generating means, said passband being narrow enough to pass only the output signal which has the frequency corresponding to the oscillation frequency data, wherein said voltage control generating means comprises:

a read-only memory which stores control voltage data depending on oscillation frequency data supplied thereto, for outputting control voltage data corresponding to the oscillation frequency data; and a digital-to-analog converter for converting the control voltage data from said read-only memory into an analog voltage as said control voltage.

2. A synthesizer according to claim 1, wherein said direct digital synthesizer comprises:

an adder for cumulatively adding the supplied oscillation frequency data in synchronism with a clock signal;

a waveform table which stores digital data according to a sine wave at each address, for producing the stored digital data addressed by a sum signal from said adder in synchronism with said clock signal; and a digital-to-analog converter for converting the digital data from said waveform table into an analog output signal in synchronism with said clock signal.

* * * * *